United States Patent
Sommer

(10) Patent No.: US 7,330,047 B2
(45) Date of Patent: Feb. 12, 2008

(54) RECEIVER CIRCUIT ARRANGEMENT HAVING AN INVERTER CIRCUIT

(75) Inventor: Michael Bernhard Sommer, Raubling (DE)

(73) Assignee: Infineon Technologies AG, Neubiberg (DE)

( * ) Notice: Subject to any disclaimer, the term of this patent is extended or adjusted under 35 U.S.C. 154(b) by 108 days.

(21) Appl. No.: 11/033,988

(22) Filed: Jan. 13, 2005

(65) Prior Publication Data

US 2005/0156624 A1    Jul. 21, 2005

(30) Foreign Application Priority Data

Jan. 16, 2004    (DE) .................. 10 2004 002 408

(51) Int. Cl.
*H03K 17/16* (2006.01)
*H03K 19/003* (2006.01)

(52) U.S. Cl. ................... 326/26; 326/27; 326/30; 326/34

(58) Field of Classification Search .......... 326/26–27, 326/31–34; 327/107–112
See application file for complete search history.

(56) References Cited

U.S. PATENT DOCUMENTS

| | | | |
|---|---|---|---|
| 5,268,599 A | | 12/1993 | Matsui |
| 5,872,464 A | * | 2/1999 | Gradinariu .............. 326/71 |
| 6,144,223 A | | 11/2000 | Momtaz |
| 6,538,466 B1 | * | 3/2003 | Lovett .................... 326/31 |
| 2004/0246760 A1 | * | 12/2004 | Hirabayashi et al. ....... 365/145 |

FOREIGN PATENT DOCUMENTS

| | | |
|---|---|---|
| DE | 41 27 212 A1 | 2/1993 |
| GB | 2 340 685 A | 2/2000 |

* cited by examiner

*Primary Examiner*—Anh Q. Tran
(74) *Attorney, Agent, or Firm*—Edell, Shapiro & Finnan, LLC

(57) ABSTRACT

A receiver circuit arrangement includes a receiver circuit an input for receiving an input signal an output for outputting an output signal and an inverter circuit with switching transistors. The input signal is fed to the receiver circuit. At least one control transistor is connected in series with the switching transistors. A control circuit is connected on the input side to a terminal for a reference voltage and on the output side to the control terminal of the control transistor of the inverter circuit. The control circuit is designed such that the control transistor is driven by the regulating switching circuit in the event of deviations of the reference voltage from a voltage value in a reference operating state with a control voltage that deviates with respect to the reference operating state.

31 Claims, 8 Drawing Sheets

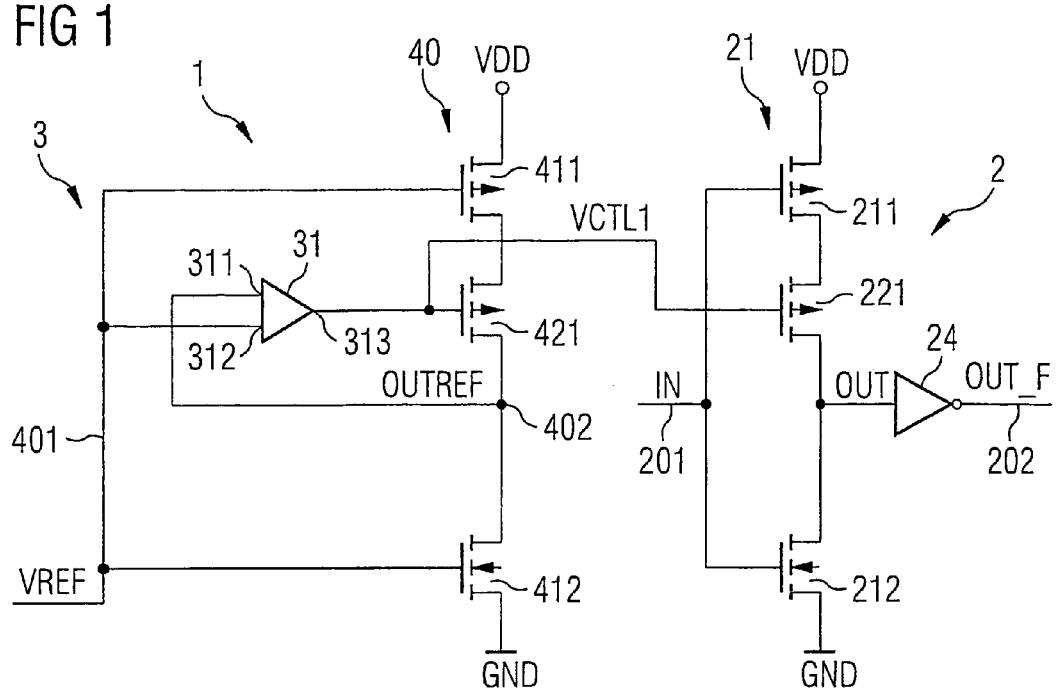
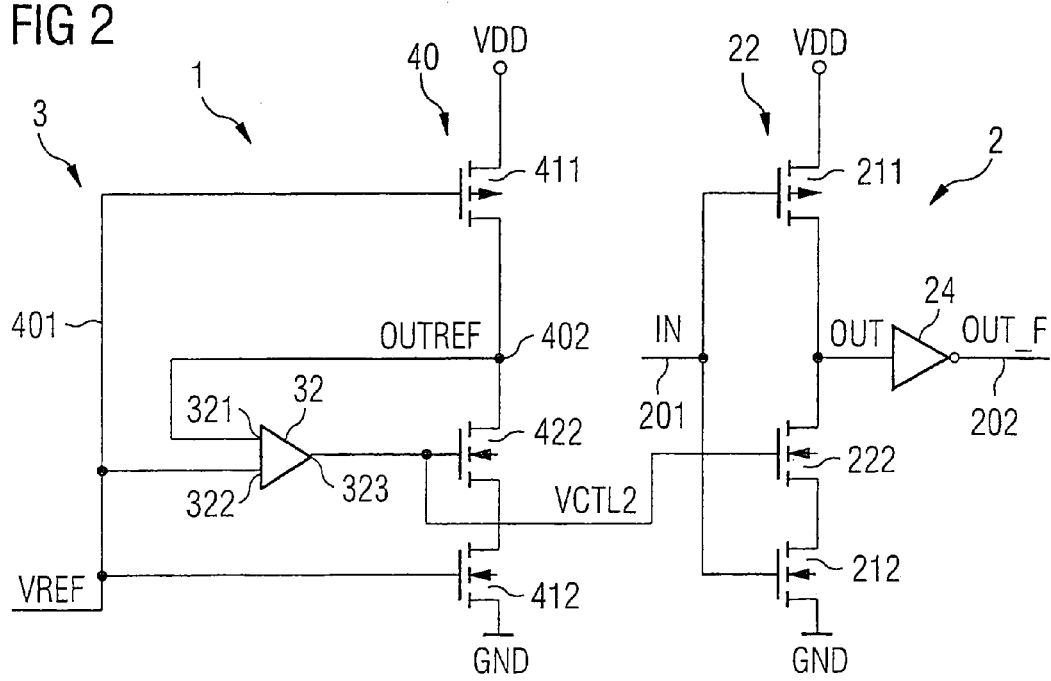

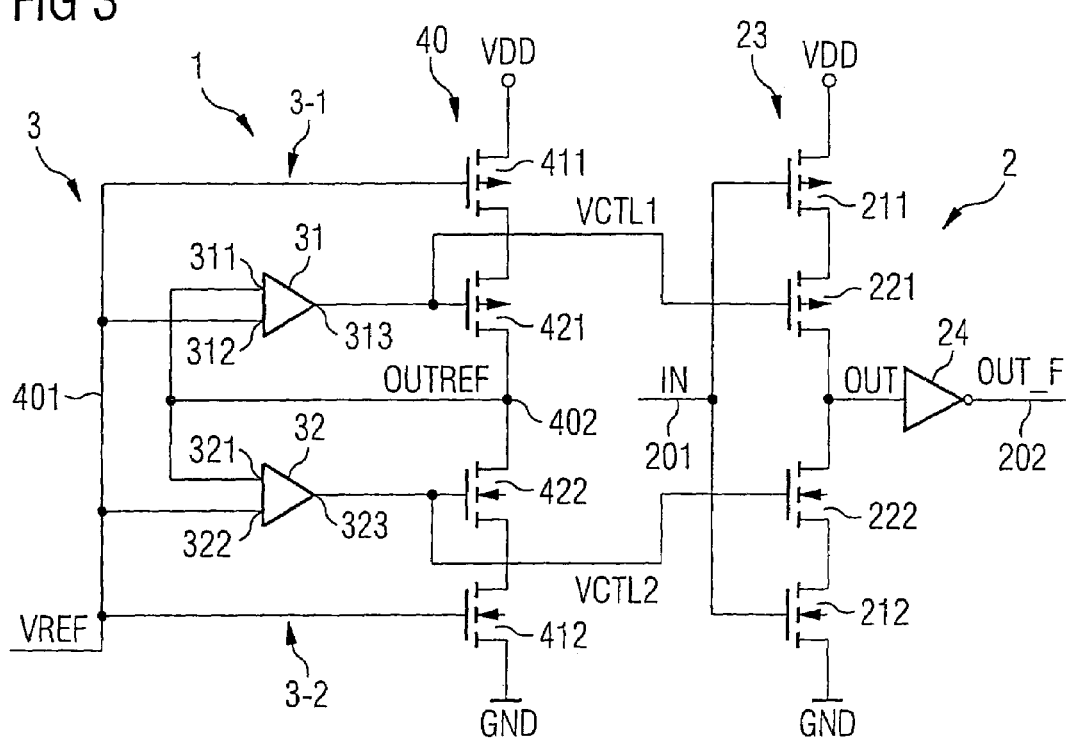

RECEIVER CIRCUIT ARRANGEMENT HAVING AN INVERTER CIRCUIT

CROSS-REFERENCE TO RELATED APPLICATIONS

This application claims priority under 35 U.S.C. §119(a) from German Patent Application No. 102004002408.1, filed Jan. 16, 2004, entitled "Controller with Inverter Circuit" the entire contents of which are hereby incorporated by reference.

FIELD OF THE INVENTION.

The present invention relates to a receiver circuit arrangement having an input for receiving an input signal and having an output for outputting an output signal, an inverter circuit being connected between the input and the output.

BACKGROUND

Receiver circuit arrangements or receivers, are used in integrated circuits in a multiplicity of applications. By way of example, a receiver circuit arrangement is provided as an input receiver on an integrated circuit in order, by way of example, to receive data from another integrated circuit. A receiver circuit arrangement of this type is connected to an input signal line for receiving a respective input signal and to an output signal line for outputting a respective output signal. By way of example, inverter circuits connected between an input signal line and output signal line are used as receiver circuit arrangements. An inverter circuit is advantageous primarily with regard to its low current consumption and high switching speeds attainable, but has the disadvantage of a comparatively high sensitivity to input signal fluctuations. A further known embodiment of a receiver circuit arrangement is a differential amplifier circuit, which has often been used as a "chip receiver" heretofore.

A differential amplifier circuit essentially comprises two input transistors, a load element and a current source. The two input transistors connected in parallel are driven by an input voltage and by a reference voltage, respectively. In this case, the input voltage is compared with a predetermined reference voltage and, depending on whether the input voltage lies above or below the reference voltage, the signal state "1" or "0" is supplied at the output of the differential amplifier. Signal transitions from the state "0" to the state "1" are generated by the input voltage being raised from a low voltage value to a high voltage value; in the event of a signal transition from the state "1" to the state "0", the input voltage of the differential amplifier is lowered from a high voltage level to a low voltage level. As soon as the signal level of the input signal reaches the value of the reference voltage, the signal of the differential amplifier changes from one state to the other.

What is problematic in this case is that the value of the reference voltage usually cannot be held at a fixedly predetermined, nominal value, but rather is subject to fluctuations, for example, on account of technological influences or temperature-dictated influences. Fluctuations in the reference voltage bring about a shift in the operating point of the circuit. This disadvantageously leads to a shift in the point of intersection at which the level of the input voltage intersects the level of the reference voltage. A further consequence is also longer or shorter switching times of the differential amplifier on account of an altered switching behavior of the switching transistors and of the current source transistor, so that the matching or synchronization of a clock signal and an input signal deteriorates.

On account of the trend toward ever smaller supply voltages of an integrated circuit, in the context of the problem area of the shift in the operating point of a differential amplifier, the problem arises that the permissible fluctuation range of the reference voltage decreases further, so that the circuit can be moved from its operating point more easily. Consequently, small deviations of the reference voltage may lead to large deviations of the "duty cycle", which denotes the ratio of the time period of, in particular, of a high signal level of a signal to the period duration of the respective signal.

SUMMARY

The present invention is based on the object of specifying a receiver circuit arrangement which is comparatively insensitive to fluctuations or deviations of a reference voltage with respect to a nominal value of a reference operating state and enables high switching speeds.

This object is achieved by a receiver circuit arrangement in accordance with patent claim 1. Alternative solutions are specified in claims 15 and 20.

The receiver circuit arrangement according to the invention has a receiver switching circuit having an input for receiving an input signal, having an output for outputting an output signal and having a first inverter circuit having switching transistors, to which the input signal is fed. In this case, at least one control transistor having a control terminal is connected in series with the switching transistors of the first inverter circuit. The first inverter circuit is connected between the input and the output of the receiver switching circuit. Furthermore, a regulating switching circuit is provided, which, on the input side, is connected to a terminal for a reference voltage and, on the output side, is connected to the control terminal of the control transistor of the first inverter circuit of the receiver switching circuit. The regulating switching circuit is designed in such a way that the control transistor is driven by the regulating switching circuit in the event of deviations of the reference voltage from a voltage value in a reference operating state with a control voltage that deviates with respect to the reference operating state.

The receiver circuit arrangement according to the invention realizes a novel concept of a receiver, in accordance with which the differential amplifier that has conventionally been used heretofore is superseded by a receiver circuit arrangement having a regulated inverter. The regulating switching circuit ensures that the dimensioning of the first inverter circuit of the receiver switching circuit is adapted in such a way that it is possible to compensate for small deviations of the reference voltage from a nominal value in a reference operating state. A very good robustness with regard to fluctuations of the reference voltage is thus obtained. Furthermore, the compactness of the circuit may lead to an improvement in the switching speeds and signal through-propagation times.

In particular, the regulating switching circuit is designed in such a way that the gain of the first inverter circuit is increased in the event of an alteration of the reference voltage with respect to the reference operating state with driving of the control transistor of the first inverter circuit by the regulating switching circuit. In particular, the inverter is driven at a high level in the event of small deviations of the reference voltage from a nominal value in a reference operating state, so that the inverter circuit of the receiver switching circuit has a high gain.

According to the concept of the invention, then, with the provision of the receiver switching circuit and the regulating switching circuit, that part of the receiver circuit arrangement which receives an input signal and outputs it at an output is separated from that part of the receiver circuit arrangement which ensures that the receiver circuit arrangement is comparatively insensitive to fluctuations or deviations of the reference voltage with respect to a nominal value in a reference operating state. Data signal and reference voltage are thus as it were decoupled from one another. The operating point of the receiver switching circuit is automatically optimized or adapted virtually "statically" with an alteration of the reference voltage. In addition, with the receiver circuit arrangement of the invention, high switching speeds can be realized through the use of an inverter circuit in the receiver switching circuit.

Further advantageous designs and developments of the invention are specified in subclaims.

BRIEF DESCRIPTION OF THE DRAWINGS

The invention is explained in more detail below with reference to the figures illustrated in the drawing, which illustrate exemplary embodiments of the present invention.

FIGS. 1 to 3 show various embodiments of receiver circuit arrangements according to the invention.

DETAILED DESCRIPTION

Figure 4:
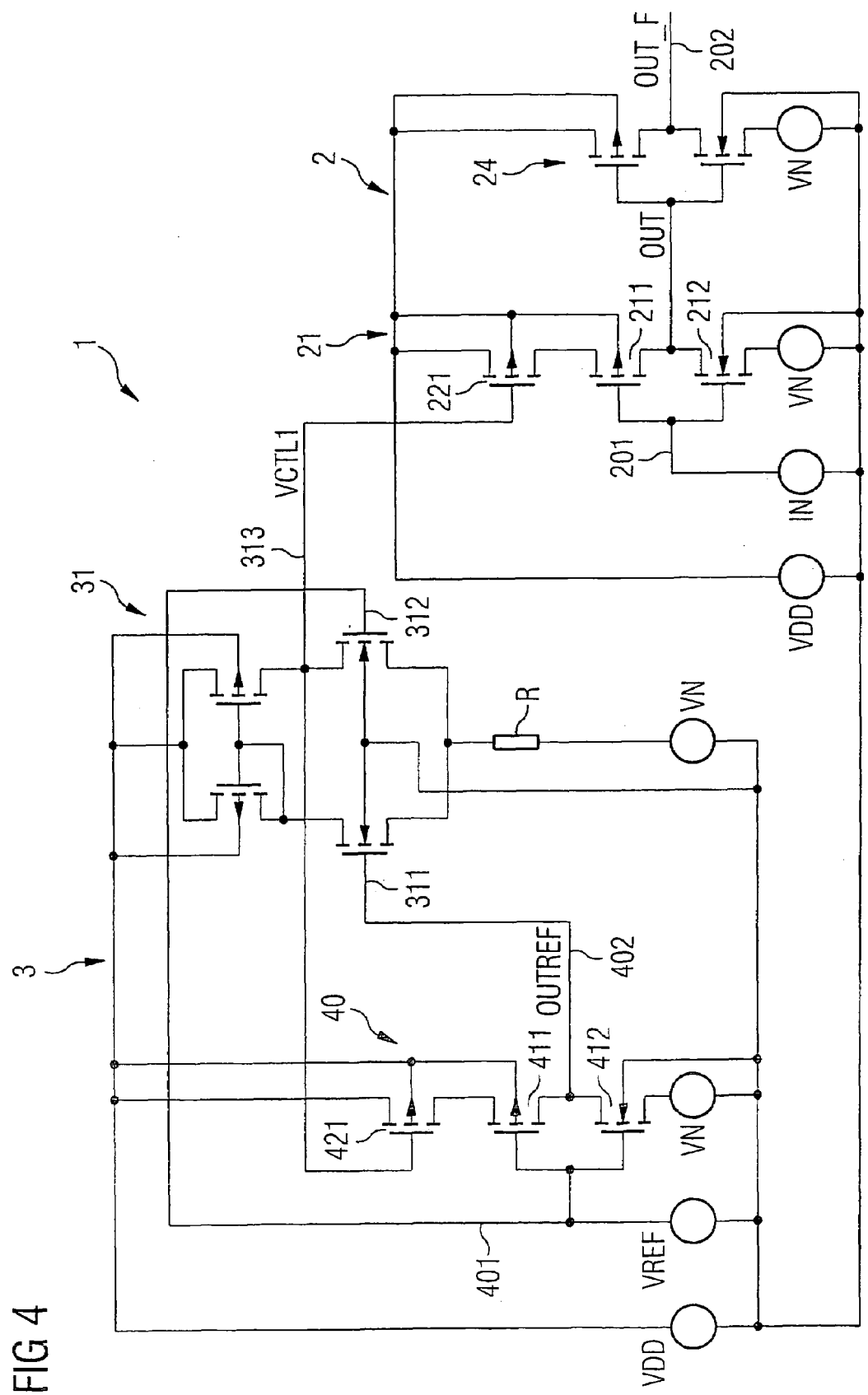
FIG. 4 shows a further embodiment of a receiver circuit arrangement according to the invention in a more detailed illustration.

FIG. 1 illustrates a first embodiment of a receiver circuit arrangement according to the invention. The receiver circuit arrangement 1 contains a receiver switching circuit 2 and a regulating switching circuit 3. The receiver switching circuit 2 has an input 201 for receiving an input signal IN and also an output 202 for outputting an output signal OUT_F. Furthermore, a first inverter circuit 21 is provided, which, for its part, has switching transistors 211 and 212 having control terminals connected to the input 201. A control transistor 221 is connected in series with the switching transistors 211 and 212, the control terminal of said control transistor being connected to the regulating switching circuit 3. With the input signal IN, by way of example, a data signal of a further integrated circuit is fed to the receiver circuit arrangement 1. The output signal OUT_F generated therefrom is processed further in the integrated circuit within which the receiver circuit arrangement 1 is provided. The receiver switching circuit 2 thus represents a chip receiver having an inverter circuit 21 for receiving the input signal IN and having a further inverter circuit 24 connected downstream for outputting the output signal OUT_F.

The regulating switching circuit 3 is connected, on the input side, to a terminal for a reference voltage VREF and, on the output side, to the control terminal of the control transistor 221 of the inverter circuit 21. The regulating switching circuit of the embodiment according to FIG. 1 has a differential amplifier 31 having a first input 311, a second input 312 and an output 313. Furthermore, a second inverter circuit 40 is provided, having an input 401, an output 402 and having switching transistors 411 and 412. A control transistor 421 is connected in series with the switching transistors 411, 412. The first input 311 of the differential amplifier 31 is connected to the output 402 of the inverter circuit 40. The second input 312 of the differential amplifier 31 and the input 401 of the inverter circuit 40 are connected to the terminal for the reference voltage VREF. The output 313 of the differential amplifier 31 is connected to the control terminal of the control transistor 421 of the inverter circuit 40 and to the control terminal of the control transistor 221 of the inverter circuit 21.

As will be explained in greater detail in the further course of the text, what is achieved by the regulating switching circuit 3 is that the control transistor 221 of the inverter circuit 21 is driven with a deviating control voltage VCTL1 if the reference voltage VREF deviates from a voltage value in a reference operating state. Accordingly, the control voltage VCTL1 differs from a voltage value in the reference operating state. In this case, the gain of the inverter circuit 21 is increased with driving of the control transistor 221 by the regulating switching circuit 3. The consequence of this is that small deviations of the reference voltage VREF cause the inverter circuit 21 to be driven at a high level, so that fluctuations in the reference voltage can be compensated for in this way. This generates a very high robustness of the receiver circuit arrangement with regard to fluctuations of the reference voltage VREF. The regulating switching circuit 3 ensures that the dimensioning of the inverter circuit 21 is adapted in such a way that a driving of the inverter circuit by an input signal with "mid-level" (signal state between 0 and 1) or a driving with the reference voltage has the consequence that the voltage of the output signal of the inverter circuit is set to the same "mid-level". The inverter circuit thus experiences its unstable state in the event of driving with the reference voltage.

FIG. 2 shows a further embodiment of a receiver circuit arrangement according to the invention in a modified form with respect to the embodiment in accordance with FIG. 1. According to the embodiment in accordance with FIG. 2, a first inverter circuit 22 of the receiver switching circuit 2 is connected between the input 201 and the output 202 of the receiver switching circuit 2. A further inverter circuit 24 is connected downstream of the inverter circuit 22. The inverter circuit 22 contains switching transistors 211 and 212, the control terminals of which are connected to the input 201 for receiving the input signal IN. A control transistor 222 is connected in series with the switching transistors 212, 212. The control transistor is driven with the control voltage VCTL2 by the regulating switching circuit 3.

The regulating switching circuit 3 of the embodiment according to FIG. 2 has a differential amplifier 32 having a first input 321, a second input 322 and an output 323.

Furthermore, a second inverter circuit 40 is provided, having an input 401, an output 402 and a control transistor 422 connected in series with the switching transistors 411 and 412. The first input 321 of the differential amplifier 32 is connected to the output 402 of the inverter circuit 40, the second input 322 of the differential amplifier 32 and the input 401 of the inverter circuit 40 are connected to the terminal for the reference voltage VREF. The output 323 of the differential amplifier 32 is connected to the control terminal of the control transistor 422 of the inverter circuit 40 and to the control terminal of the control transistor 222 of the inverter circuit 22.

The control transistor 222 of the inverter circuit 22 is of the n conductivity type and connected between a terminal for a reference-ground voltage GND or a negative supply voltage (not illustrated in FIG. 2) and the output of the inverter circuit 22. By contrast, the control transistor 221 of the inverter circuit 21 in accordance with FIG. 1 is of the p conductivity type and connected between a terminal for the positive supply voltage VDD and the output of the inverter circuit 21. The circuits according to FIGS. 1 and 2 function analogously to one another, in both cases the gain of the inverter circuit 21 and 22, respectively, being increased in the case where the reference voltage VREF is altered with respect to a nominal value in a reference operating state.

The control transistor 422 of the inverter circuit 40 in accordance with FIG. 2 is of the n conductivity type and connected between the terminal for the reference-ground voltage GND (or a negative supply voltage) and the output 402 of the inverter circuit 40. By contrast, the control transistor 421 of the inverter circuit 40 according to FIG. 1 is of the p conductivity type and connected between the terminal for the positive supply voltage VDD and the output 402 of the inverter circuit 40.

FIG. 4 shows a further embodiment of a receiver circuit arrangement according to the invention, on the basis of which the functioning of a receiver circuit arrangement according to the invention will be explained in more detail. In this case, the circuit in accordance with FIG. 4 is constructed in conformity with the circuit in accordance with FIG. 1 apart from a few discrepancies. In contrast to the embodiment in accordance with FIG. 1, the positions of the switching transistors 211 and of the control transistor 221 are interchanged in the embodiment according to FIG. 4. The control transistor 221 are still connected between the terminal for the positive supply voltage VDD and the output of the inverter circuit 21. Analogously to this, the positions of the switching transistor 411 and of the control transistor 421 of the inverter circuit 40 are also interchanged in the embodiment according to FIG. 4 with respect to the embodiment according to FIG. 1.

For the purpose of explaining the functioning of the receiver circuit arrangement according to FIG. 4, it shall firstly be assumed that the reference voltage VREF increases with respect to its nominal value in a reference operating state, for example from 1.25 V as nominal value through to 1.3 V. The inverter circuit 40 consequently shifts from its unstable state, the voltage value of the signal OUTREF being lowered. The control voltage VCTL1 is lowered as a consequence of this, so that the control transistors 421 and 221 move into a more highly conducting state. With regard to the inverter circuit 40, this has the consequence that the voltage of the signal OUTREF increases again, this regulating process proceeding until the voltage of the signal OUTREF assumes the value of the reference voltage VREF (1.3 V in the example).

The regulating switching circuit 3 thus ensures that the dimensioning of the inverter circuit 21 is adapted in such a way that a driving of the inverter circuit with "mid-level" (or the reference voltage) has the consequence that the output voltage of the inverter circuit is set to the same "mid-level". The inverter circuit 21 thus experiences its unstable state at the reference voltage VREF. The consequence of this is that small deviations from the reference voltage cause the inverter circuit to be driven at a high level and the input stage thus has a high gain. In the present exemplary embodiment according to FIG. 4, the switching transistor 212 of the inverter circuit 21 and the switching transistor 412 of the inverter circuit 40 are connected to a negative supply voltage VN. The differential amplifier 31 is also connected to the negative supply voltage VN via a resistor R.

FIG. 3 shows a further embodiment of a receiver circuit arrangement according to the invention. The exemplary embodiments according to FIGS. 1 and 2 are combined with one another in accordance with this embodiment. The receiver circuit arrangement 2 has a first inverter circuit 23 containing, in series with the switching transistors 211 and 212, a first control transistor 221 and a second control transistor 222 of a different conduction type. In particular, the first control transistor 221 of the inverter circuit 23 is of the p conductivity type and connected between the terminal for the positive supply voltage VDD and the output of the inverter circuit 23. The second control transistor 222 of the inverter circuit 23 is of the n conductivity type and connected between the terminal for a reference-ground voltage GND (or a negative supply voltage) and the output of the inverter circuit 23.

A first regulating switching circuit 3-1 is connected, on the input side, to the terminal for the reference voltage VREF, and on the output side, to the control terminal of the first control transistor 221 of the inverter circuit 23. A second regulating switching circuit 3-2 is connected, on the input side, to the terminal of the reference voltage VREF and, on the output side, to the control terminal of the second control transistor 222 of the inverter circuit 23. In this case, the first regulating switching circuit 3-1 comprises a first differential amplifier 31 having a first input 311, a second input 312, and an output 313. Furthermore, the regulating switching circuit 3-1 contains a second inverter circuit 40 having an input 401, an output 402 and a first control transistor 421 connected in series with the switching transistors 411 and 412 of the second inverter circuit 40. The first input 311 of the differential amplifier 31 is connected to the output 402 of the inverter circuit 40, and the second input 312 of the differential amplifier 31 and the input 401 of the inverter circuit 40 are connected to the terminal for the reference voltage VREF. The output 313 of the differential amplifier 31 is connected to the control terminal of the first control transistor 421 of the inverter circuit 40 and to the control terminal of the first control transistor 221 of the inverter circuit 23.

The second regulating switching circuit 3-2 comprises a second differential amplifier 32 having a first input 321, a second input 322, and an output 323. The regulating switching circuit 3-2 shares the inverter circuit 40 with the regulating switching circuit 3-1. A second control transistor 422 driven by the differential amplifier 32 is provided. The second control transistor is connected in series with the switching transistors 411 and 412 of the inverter circuit 40. The first input 321 of the differential amplifier 32 is connected to the output 402 of the inverter circuit 40, and the second input 322 of the differential amplifier 32 is connected to the terminal for the reference voltage VREF. The output 323 of the differential amplifier 32 is connected to the control terminal of the second control transistor 422 of the inverter circuit 40 and to the control terminal of the second control transistor 222 of the inverter circuit 23. The first control transistor 421 of the inverter circuit 40 is of the p conductivity type and connected between the terminal for the positive supply voltage VDD and the output 402 of the inverter circuit 40. The second control transistor 422 of the inverter circuit 40 is of the n conductivity type and connected between the terminal for the reference-ground voltage GND (or a negative supply voltage) and the output 402 of the inverter circuit 40.

The first regulating switching circuit 3-1 generates a first control voltage VCTL1 which, in the event of deviations of the reference voltage VREF from a voltage value in a reference operating state, deviates with respect to a corresponding nominal value in the reference operating state. Correspondingly, the second regulating switching circuit 3-2 generates a second control voltage VCTL2 which, in the event of deviations of the reference voltage VREF from a voltage value in the reference operating state, deviates from a corresponding nominal value in the reference operating state. In this case, the first control voltage VCTL1 is different from the second control voltage VCTL2.

Figure 5:
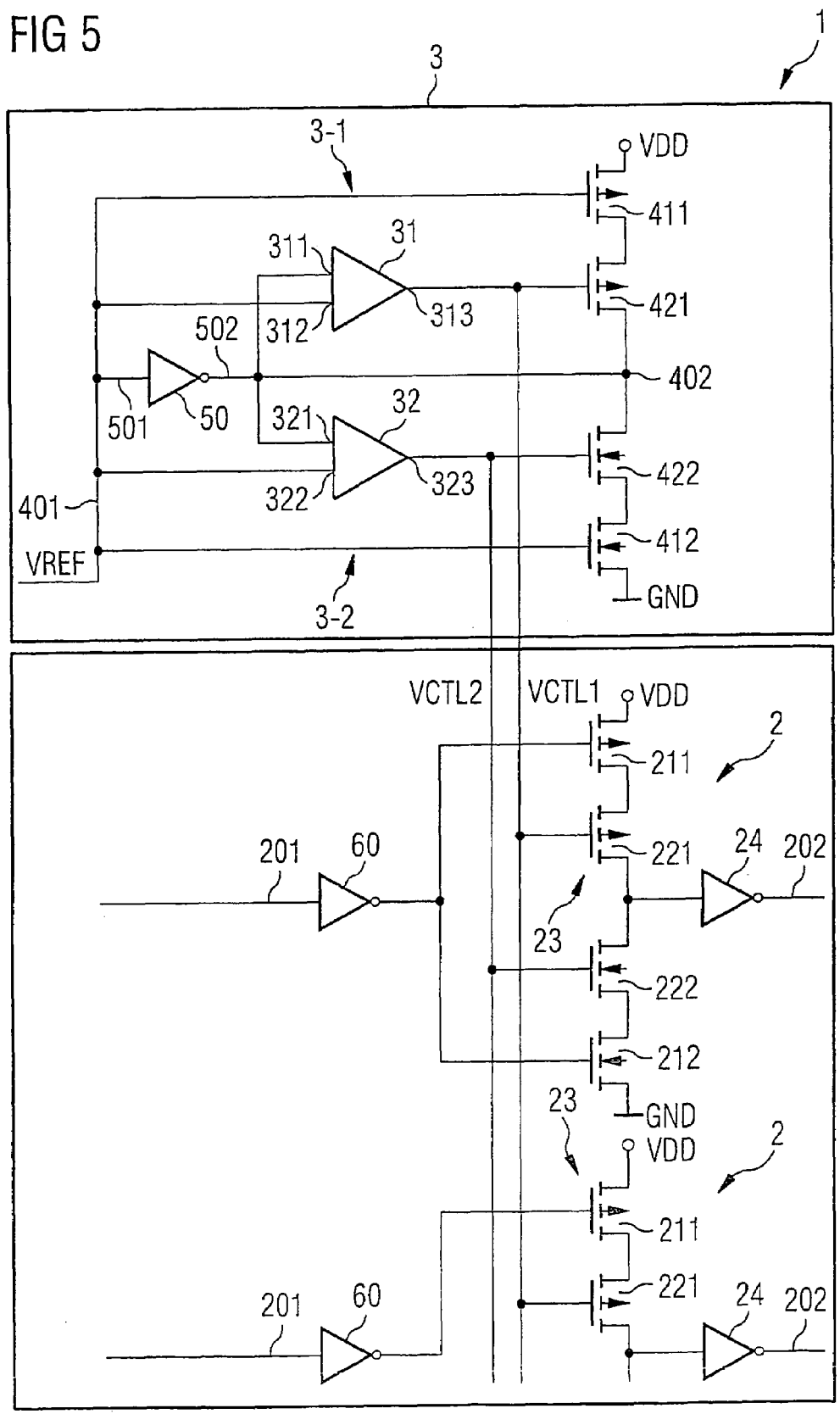
FIG. 5 shows a further embodiment of a receiver circuit arrangement according to the invention.

FIG. 5 shows a further embodiment of a receiver circuit arrangement according to the invention, which largely follows the embodiment in accordance with FIG. 3. The receiver circuit arrangement 1 has a regulating switching circuit 3 which, in contrast to the exemplary embodiment according to FIG. 3, drives a plurality of receiver switching circuits 2. This modular construction enables a receiver circuit arrangement according to the invention to be arranged in a space-saving manner. In particular, it becomes possible to provide only one regulating switching circuit for a multiplicity of receiver switching circuits, which regulating switching circuit ensures that influences of the reference voltage on the switching behavior of the receiver circuit arrangements are largely compensated for.

In contrast to the exemplary embodiment in accordance with FIG. 3, in the case of the receiver circuit arrangement according to FIG. 5, a third inverter circuit 50 having an input 501 and an output 502 is provided in the regulating switching circuit 3. The input 501 of the inverter circuit 50 is connected to the terminal for the reference voltage VREF and the output 502 of the inverter circuit 50 is connected to the first input 311 of the differential amplifier 31 and the first input 321 of the differential amplifier 32. Inverter circuits 60 that are respectively connected upstream of the inputs of the inverter circuits 23 are furthermore provided. The provision of the inverter circuit 50 in the regulating switching circuit 3 has the advantage that possible mutual influencing of the regulating switching circuits 3-1 and 3-2 and associated oscillations in the regulating behavior are largely prevented.

FIGS. 6 to 9 show exemplary signal diagrams of a receiver circuit arrangement according to FIG. 4.

Figure 6:
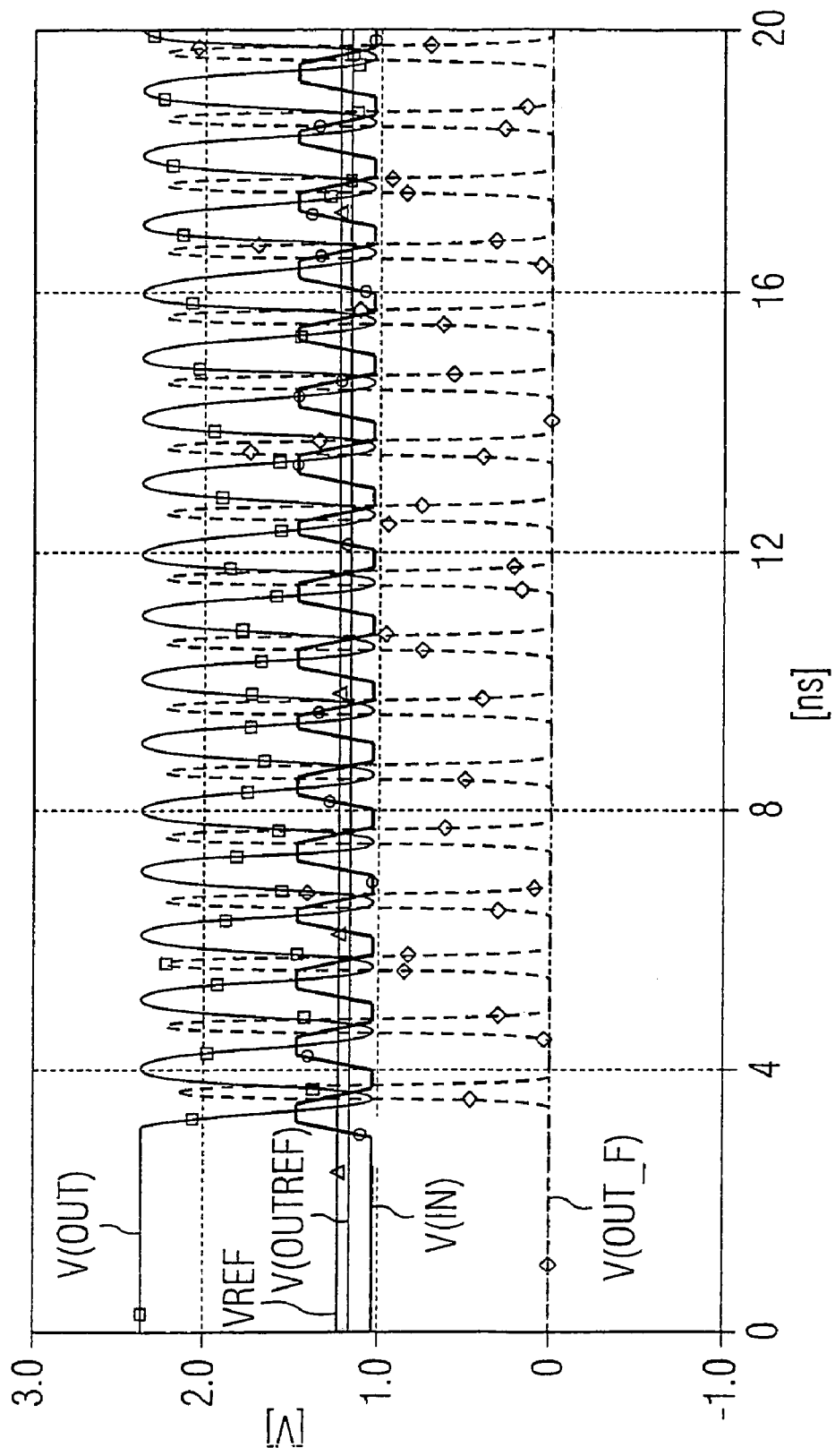
FIG. 6 shows an exemplary signal diagram of a receiver circuit arrangement according to FIG. 4 given a frequency of the input signal of 1 GHz and a nominal reference voltage.

FIG. 6 illustrates a signal diagram according to which an input signal IN having a frequency of 1 GHz, given a nominal reference voltage VREF, is fed into the receiver circuit arrangement. In FIG. 6 and also in the subsequent Figures, the profile of the voltage values of the signals OUT, OUTREF, IN and OUT_F is designated by V(OUT), V(OUTREF), V(IN) and V(OUT_F), respectively. It is evident from the profile from FIG. 6 that the receiver circuit arrangement is functional, in principle, even at very high frequencies of 1 GHz, which expresses the fact that very high switching speeds are made possible with the receiver circuit arrangement according to the invention.

Figure 7:
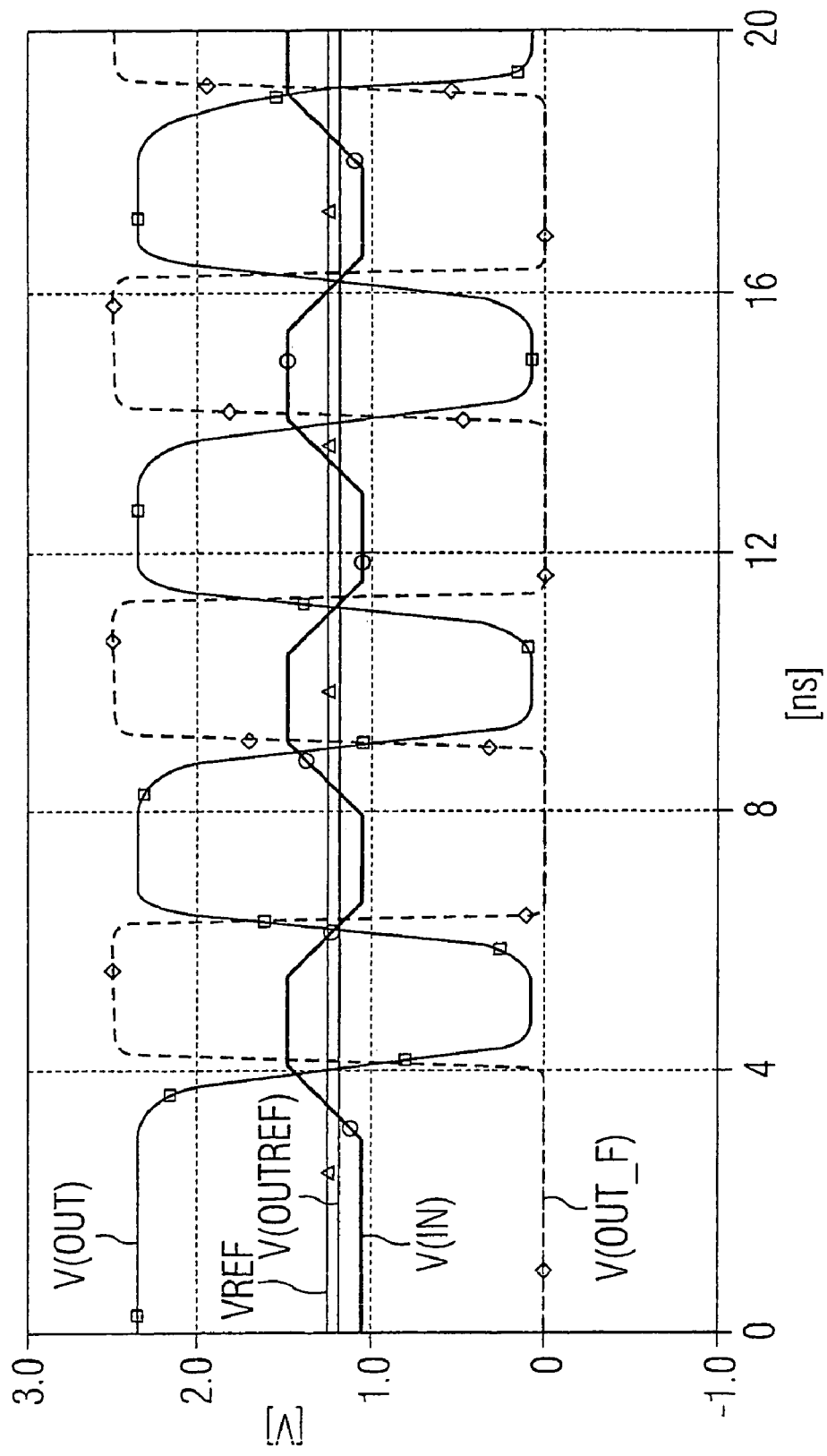
FIG. 7 shows an exemplary signal diagram of a receiver circuit arrangement according to FIG. 4 given a frequency of the input signal of 200 MHz and a nominal reference voltage.

The signal diagram according to FIG. 7 shows the voltage profiles of the signals according to FIG. 6 for a frequency of the input signal IN of 200 MHz given a nominal reference voltage VREF. It is evident that the "duty cycle" of the signal OUT_F approaches the value 0.5.

Figure 8:
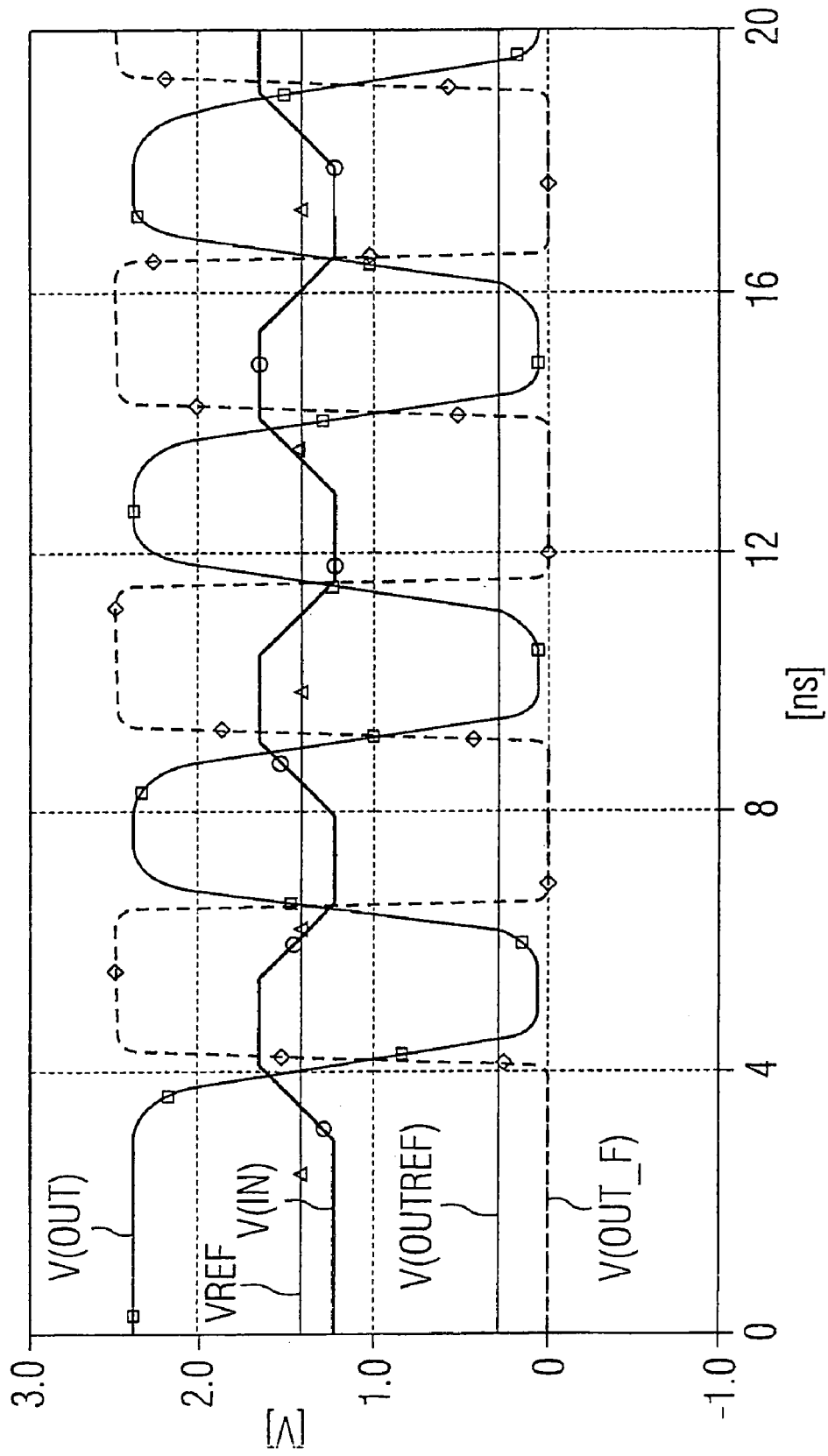
FIG. 8 shows an exemplary signal diagram of a receiver circuit arrangement according to FIG. 4 given a frequency of the input signal of 200 MHz and given a deviation of the reference voltage of 200 mV with respect to a nominal value.

FIG. 8 shows a signal diagram for the abovementioned signals, but with the value of the reference voltage VREF deviating by 200 mV with respect to a nominal value. It is of significance in this connection that now the input signal IN varies about the increased value CREF, i.e., that the "mid-level" of the signal IN is increased by 200 mV. It is evident that the receiver circuit arrangement according to the invention is suitable, even in the event of a shift in the reference voltage VREF, for generating an output signal OUT_F which essentially has the "duty cycle" in accordance with FIG. 7. Consequently, the compensation of the alteration of the reference voltage VREF prevents the formation of signal distortions at the output signal OUT_F.

Figure 9:
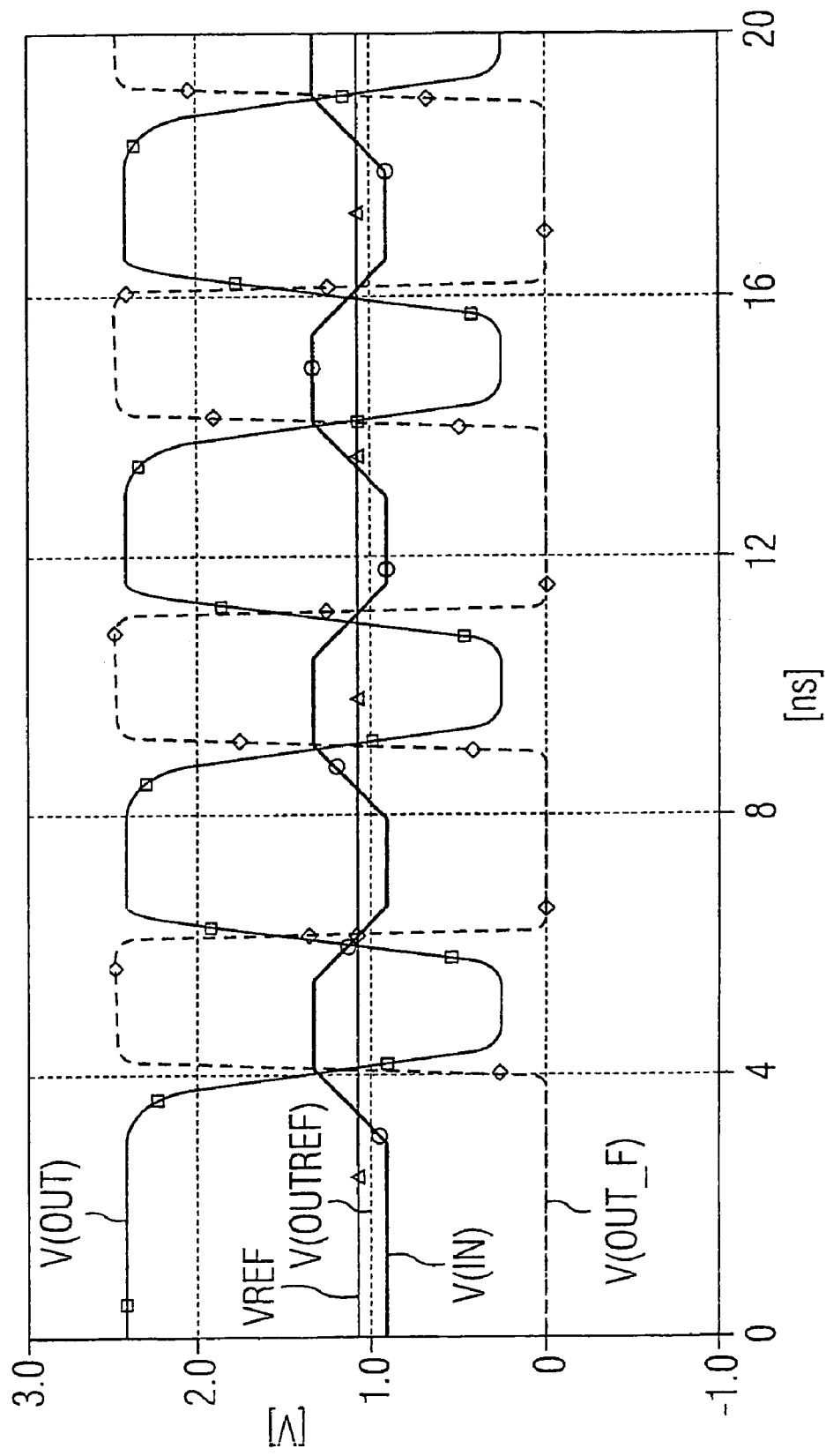
FIG. 9 shows an exemplary signal diagram of a receiver circuit arrangement according to FIG. 4 given a frequency of the input signal of 200 MHz and given a deviation of the reference voltage of −200 mV with respect to a nominal value.

FIG. 9 shows a signal diagram of the abovementioned signals, in this case the reference voltage VREF deviating by a value −200 mV from a nominal value in a reference operating state, the frequency of the input signal IN again being 200 MHz. In this case, too, an effective compensation of the alteration of the reference voltage VREF leads to the "duty cycle" of the signal OUT_F essentially retaining the value in accordance with the signal diagram according to FIG. 7.

It is possible, in principle, to further optimize the signal profiles according to FIGS. 6 and 9 and the underlying receiver circuit arrangement, for instance with regard to minimum current consumption, a preset "duty cycle", or with regard to the compensation of specific influences in the production of an integrated circuit.

| List of reference symbols | |
|---|---|
| 1 | Receiver circuit arrangement |
| 2 | Receiver switching circuit |
| 3 | Regulating switching circuit |
| 21, 22, 23 | Inverter circuit |
| 24 | Inverter circuit |
| 31, 32 | Differential amplifier |
| 40 | Inverter circuit |
| 50 | Inverter circuit |
| 60 | Inverter circuit |
| 3-1, 3-2 | Regulating switching circuit |
| 211, 212 | Switching transistor |
| 221, 222 | Control transistor |
| 201 | Input |
| 202 | Output |
| 311, 312 | Input |
| 313 | Output |
| 321, 322 | Input |
| 323 | Output |
| 401 | Input |
| 402 | Output |
| 411, 412 | Switching transistor |
| 421, 422 | Control transistor |
| VREF | Reference voltage |
| GND | Reference-ground voltage |
| VDD | Positive supply voltage |
| VN | Negative supply voltage |
| IN | Input signal |
| OUT | Signal |
| OUT_F | Output signal |
| OUTREF | Signal |
| VCTL1, VCTL2 | Control voltage |

The invention claimed is:

1. A receiver circuit arrangement, comprising:
    a receiver circuit comprising: a first inverter circuit with switching transistors configured to receive an input signal; and at least one control transistor connected between and in series with the switching transistors; and
    a control circuit comprising: a second inverter circuit with switching transistors and a control transistor connected between and in series with the switching transistors of the second inverter circuit, the second inverter circuit receiving a reference voltage; and a differential amplifier which receives an output of the second inverter circuit and the reference voltage, wherein an output of the differential amplifier is supplied to the control transistor of the second inverter circuit and to the control transistor of the first inverter circuit such that the control transistor of the first inverter circuit is driven with a control voltage that is responsive to deviations of the reference voltage from a voltage value in a reference operating state.

2. The receiver circuit arrangement as claimed in claim 1, wherein the control circuit is designed such that a gain of the first inverter circuit is increased in the event of an alteration of the reference voltage with respect to the reference operating state.

3. A receiver circuit arrangement, comprising:
    a receiver circuit comprising: a first inverter circuit with switching transistors configured to receive an input signal; and at least one control transistor connected in series with the switching transistors; and
    a control circuit comprising:
        a second inverter circuit with switching transistors and a control transistor connected in series with the switching transistors, the second inverter circuit receiving a reference voltage;
        a differential amplifier which receives the output of the second inverter circuit, and the reference voltage, wherein an output of the differential amplifier is supplied to the control transistor of the second inverter circuit and to the control transistor of the first inverter circuit such that the control transistor of the first inverter circuit is driven with a control voltage that is responsive to deviations of the reference voltage from a voltage value in a reference operating state; and
        a third inverter circuit which receives the reference voltage and supplies an output signal to the differential amplifier.

4. The receiver circuit arrangement as claimed in claim 1, wherein the control transistor of the first inverter circuit is of the p conductivity type and is connected between a terminal for a positive supply voltage and an output of the first inverter circuit.

5. The receiver circuit arrangement as claimed in claim 1, wherein the control transistor of the first inverter circuit is of the n conductivity type and is connected between a terminal for a reference ground or a negative supply voltage and an output of the first inverter circuit.

6. The receiver circuit arrangement as claimed in claim 1, wherein the control transistor of the second inverter circuit is of the p conductivity type and is connected between a terminal for a positive supply voltage and an output of the second inverter circuit.

7. The receiver circuit arrangement as claimed in claim 1, wherein the control transistor of the second inverter circuit is of the n conductivity type and is connected between a terminal for a reference voltage or a negative supply voltage and an output of the second inverter circuit.

8. A receiver circuit arrangement, comprising:
    a receiver circuit comprising: a first inverter circuit with switching transistors configured to receive an input signal; and first and second control transistors of a different conduction type connected between and in series with the switching transistors; and
    a control circuit configured to receive a reference voltage and to drive the control transistor of the first inverter circuit with a control voltage that is responsive to deviations of the reference voltage from a voltage value in a reference operating state, wherein the control circuit comprises:
    a first regulating switching circuit configured to receive the reference voltage and to supply an output signal to the first control transistor of the first inverter circuit; and
    a second regulating switching circuit configured to receive the reference voltage and to supply an output signal to the second control transistor of the first inverter circuit.

9. The receiver circuit arrangement as claimed in claim 8, wherein the first regulating switching circuit is designed such that the first control transistor is driven by the first regulating switching circuit in the event of deviations of the reference voltage from the voltage value in the reference operating state with a first control voltage that deviates with respect to the reference operating state, and
    the second regulating switching circuit is designed such that the second control transistor is driven by the second regulating switching circuit in the event of deviations of the reference voltage from the voltage value in the reference operating state with a second control voltage that deviates with respect to the reference operating state, the second control voltage being different from the first control voltage.

10. The receiver circuit arrangement as claimed in claim 8, wherein the first regulating switching circuit includes:
    a second inverter circuit with switching transistors and a control transistor connected between and in series with the switching transistors of the second inverter circuit, the second inverter circuit receiving the reference voltage; and
    a first differential amplifier which receives an output of the second inverter circuit and the reference voltage, wherein an output of the first differential amplifier is supplied to the control transistor of the second inverter circuit and to the control transistor of the first inverter circuit.

11. The receiver circuit arrangement as claimed in claim 8, wherein the second regulating switching circuit includes:
    a second inverter circuit with switching transistors and a control transistor connected between and in series with the switching transistors of the second inverter circuit, the second inverter circuit receiving the reference voltage; and
    a second differential amplifier which receives an output of the second inverter circuit and the reference voltage, wherein an output of the second differential amplifier is supplied to the control transistor of the second inverter circuit and to the control transistor of the first inverter circuit.

12. The receiver circuit arrangement as claimed in claim 8, wherein the first control transistor of the first inverter circuit is of the p conductivity type and is connected between a terminal for a positive supply voltage and an output of the first inverter circuit, and the second control transistor of the first inverter circuit is of the n conductivity type and is connected between a terminal for a reference ground or a negative supply voltage and an output of the first inverter circuit.

13. The receiver circuit arrangement as claimed in claim 8, wherein the first control transistor of the second inverter circuit is of the p conductivity type and is connected between a terminal for a positive supply voltage and the output of the second inverter circuit, and the second control transistor of the second inverter circuit is of the n conductivity type and is connected between a terminal for a reference ground or a negative supply voltage and the output of the second inverter circuit.

14. A receiver circuit arrangement, comprising:

a receiver circuit with an input for receiving an input signal, an output for outputting an output signal, and a first inverter circuit with switching transistors, to which the input signal is fed, at least one control transistor with a control terminal being connected between and in series with the switching transistors, the first inverter circuit being connected between the input and the output of the receiver circuit;

a control circuit connected on the input side to a terminal for a reference voltage and connected on the output side to the control terminal of the control transistors of the first inverter circuit, the control circuit including a differential amplifier with a first input, a second input and an output; and a second inverter circuit with an input, an output, switching transistors and a control transistor connected between and in series with the switching transistors of the second inverter circuit, the first input of the differential amplifier being connected to the output of the second inverter circuit, the second input of the differential amplifier and the input of the second inverter circuit being connected to the terminal for the reference voltage, the output of the differential amplifier being connected to a control terminal of the control transistor of the second inverter circuit and to the control terminal of the control transistor of the first inverter circuit.

15. The receiver circuit arrangement as claimed in claim 14, wherein the control circuit is designed such that a gain of the first inverter circuit is increased in the event of an alteration of the reference voltage with respect to the reference operating state with driving of the control transistor.

16. A receiver circuit arrangement, comprising:

a receiver circuit with an input for receiving an input signal, an output for outputting an output signal, and a first inverter circuit with switching transistors, to which the input signal is fed, at least one control transistor with a control terminal being connected in series with the switching transistors, the first inverter circuit being connected between the input and the output of the receiver circuit;

a control circuit connected on the input side to a terminal for a reference voltage and connected on the output side to the control terminal of the control transistors of the first inverter circuit, the control circuit including a differential amplifier with a first input, a second input and an output, wherein the control circuit is designed such that a gain of the first inverter circuit is increased in the event of an alteration of the reference voltage with respect to the reference operating state with driving of the control transistor;

a second inverter circuit with an input, an output, switching transistors and a control transistor connected in series with the switching transistors of the second inverter circuit, the first input of the differential amplifier being connected to the output of the second inverter circuit, the second input of the differential amplifier and the input of the second inverter circuit being connected to the terminal for the reference voltage, the output of the differential amplifier being connected to a control terminal of the control transistor of the second inverter circuit and to the control terminal of the control transistor of the first inverter circuit; and a third inverter circuit with an input and an output, the input of the third inverter circuit being connected to the terminal for the reference voltage and the output of the third inverter circuit being connected to the first input of the differential amplifier.

17. The receiver circuit arrangement as claimed in claim 14, wherein the control transistor of the first inverter circuit is of the p conductivity type and is connected between a terminal for a positive supply voltage and an output of the first inverter circuit.

18. The receiver circuit arrangement as claimed in claim 14, wherein the control transistor of the first inverter circuit is of the n conductivity type and is connected between a terminal for a reference ground or a negative supply voltage and an output of the first inverter circuit.

19. A receiver circuit arrangement, comprising:

a receiver circuit with an input for receiving an input signal, an output for outputting an output signal, and a first inverter circuit with switching transistors and first and second control transistors with respective control terminals, the first and second control transistors being connected between and in series with the switching transistors, the first inverter circuit being connected between the input and the output of the receiver circuit;

a control circuit comprising: a first regulating switching circuit connected on the input side to a terminal for a reference voltage and on the output side to the control terminal of the first control transistor of the first inverter circuit; and a second regulating switching circuit connected on the input side to the terminal for the reference voltage and on the output side to the control terminal of the second control transistor of the first inverter circuit, wherein the first and second control transistors are respectively driven by the first and second regulating switching circuits in the event of deviations of the reference voltage from a voltage value in a reference operating state with a control voltage that deviates with respect to the reference operating state.

20. The receiver circuit arrangement as claimed in claim 19, wherein the first regulating switching circuit is designed such that the first control transistor is driven by the first regulating switching circuit in the event of deviations of the reference voltage from a voltage value in a reference operating state with a first control voltage that deviates with respect to the reference operating state, and the second regulating switching circuit is designed such that the second control transistor is driven by the second regulating switching circuit in the event of deviations of the reference voltage from a voltage value in a reference operating state with a second control voltage that deviates with respect to the reference operating state, the second control voltage being different from the first control voltage.

21. The receiver circuit arrangement as claimed in claim 19, wherein the first regulating switching circuit includes:
- a first differential amplifier with a first input, a second input, and an output,
- a second inverter circuit with an input, an output, switching transistors and a first control transistor connected between and in series with the switching transistors of the second inverter circuit,
- the first input of the first differential amplifier being connected to the output of the second inverter circuit,
- the second input of the first differential amplifier and the input of the second inverter circuit being connected to the terminal for the reference voltage, and
- the output of the first differential amplifier being connected to a control terminal of the first control transistor of the second inverter circuit and to the control terminal of the first control transistor of the first inverter circuit.

22. The receiver circuit arrangement as claimed in claim 19, wherein the second regulating switching circuit includes:
- a second differential amplifier with a first input, a second input and an output,
- a second inverter circuit comprising: an input, an output, switching transistors and a second control transistor connected between and in series with switching transistors of the second inverter circuit,
- the first input of the second differential amplifier being connected to the output of the second inverter circuit,
- the second input of the second differential amplifier and the input of the second inverter circuit being connected to the terminal for the reference voltage, and
- the output of the second differential amplifier being connected to a control terminal of the second control transistor of the second inverter circuit and to the control terminal of the second control transistor of the first inverter circuit.

23. The receiver circuit arrangement as claimed in claim 19, wherein
- the first control transistor of the first inverter circuit is of the p conductivity type and is connected between a terminal for a positive supply voltage and an output of the first inverter circuit, and
- the second control transistor of the first inverter circuit is of the n conductivity type and is connected between a terminal for a reference ground or a negative supply voltage and an output of the first inverter circuit.

24. The receiver circuit arrangement as claimed in claim 19, wherein
- the first control transistor of the second inverter circuit is of the p conductivity type and is connected between a terminal for a positive supply voltage and the output of the second inverter circuit, and
- the second control transistor of the second inverter circuit is of the n conductivity type and is connected between a terminal for a reference ground or a negative supply voltage and the output of the second inverter circuit.

25. A receiver circuit arrangement, comprising:
- a receiver circuit including a first inverter circuit with switching transistors and at least first and second control transistors connected between and in series with the switching transistors, the first inverter circuit being coupled between an input and an output of the receiver circuit and being configured to receive an input signal; and
- a control circuit comprising:
  - a first differential amplifier configured to receive a reference voltage and to drive the first control transistor of the first inverter circuit with a first control voltage in response to the reference voltage deviating from a voltage value in a reference operating state; and
  - a second differential amplifier configured to receive the reference voltage and to drive the second control transistor of the first inverter circuit with a second control voltage in response to the reference voltage deviating from a voltage value in the reference operating state, wherein the second control voltage is different from the first control voltage.

26. The receiver circuit arrangement as claimed in claim 25, wherein the control circuit further comprises:
- a second inverter circuit with switching transistors and a control transistor connected between and in series with the switching transistors of the second inverter circuit, the second inverter circuit receiving the reference voltage;
- wherein the first differential amplifier receives an output of the second inverter circuit and the first control voltage is supplied to the control transistor of the second inverter circuit.

27. The receiver circuit arrangement as claimed in claim 25, wherein the control circuit further comprises:
- a second inverter circuit with switching transistors and a control transistor connected between and in series with the switching transistors of the second inverter circuit, the second inverter circuit receiving the reference voltage;
- wherein the second differential amplifier receives an output of the second inverter circuit and the second control voltage is supplied to the control transistor of the second inverter circuit.

28. The receiver circuit arrangement as claimed in claim 3, wherein the control transistor of the first inverter circuit is of the p conductivity type and is connected between a terminal for a positive supply voltage and an output of the first inverter circuit.

29. The receiver circuit arrangement as claimed in claim 3, wherein the control transistor of the first inverter circuit is of the n conductivity type and is connected between a terminal for a reference ground or a negative supply voltage and an output of the first inverter circuit.

30. The receiver circuit arrangement as claimed in claim 16, wherein the control transistor of the first inverter circuit is of the p conductivity type and is connected between a terminal for a positive supply voltage and an output of the first inverter circuit.

31. The receiver circuit arrangement as claimed in claim 16, wherein the control transistor of the first inverter circuit is of the n conductivity type and is connected between a terminal for a reference ground or a negative supply voltage and an output of the first inverter circuit.

* * * * *